(12) United States Patent
Chang et al.

(10) Patent No.: US 9,112,508 B2
(45) Date of Patent: Aug. 18, 2015

(54) ADAPTIVE POWERED LOCAL OSCILLATOR GENERATOR CIRCUIT AND RELATED METHOD

(75) Inventors: Yuyu Chang, Irvine, CA (US); Ahmad Yazdi, Irvine, CA (US); Hooman Darabi, Laguna Niguel, CA (US)

(73) Assignee: BROADCOM CORPORATION, Irvine, CA (US)

( * ) Notice: Subject to any disclaimer, the term of this patent is extended or adjusted under 35 U.S.C. 154(b) by 211 days.

(21) Appl. No.: 12/802,604

(22) Filed: Jun. 9, 2010

(65) Prior Publication Data

US 2011/0306311 A1 Dec. 15, 2011

(51) Int. Cl.
*H03L 1/00* (2006.01)

(52) U.S. Cl.
CPC ........................................ *H03L 1/00* (2013.01)

(58) Field of Classification Search
USPC ........ 455/86, 141, 147, 196.1, 208, 255, 258, 455/318
See application file for complete search history.

(56) References Cited

U.S. PATENT DOCUMENTS

| | | |
|---|---|---|
| 3,652,948 A | 3/1972 | Fierstien |
| 4,591,795 A | 5/1986 | McCorkle |
| 4,701,722 A | 10/1987 | Dolby |
| 4,706,262 A | 11/1987 | Ohta |
| 4,904,921 A | 2/1990 | DeVito |
| 5,089,716 A | 2/1992 | Wallis |
| 5,185,581 A | 2/1993 | Brown |
| 5,241,694 A | 8/1993 | Vaeis |
| 5,432,473 A | 7/1995 | Mattila |
| 5,530,923 A | 6/1996 | Heinonen |
| 5,606,285 A | 2/1997 | Wang |
| 5,697,074 A | 12/1997 | Makikallio |
| 5,705,957 A * | 1/1998 | Oka et al. .......................... 331/66 |
| 5,777,468 A | 7/1998 | Maher |
| 6,046,641 A | 4/2000 | Chawla |
| 6,064,262 A | 5/2000 | Wang |
| 6,232,842 B1 | 5/2001 | Asano |
| 6,606,359 B1 | 8/2003 | Nag |
| 6,864,808 B2 | 3/2005 | McBrien |
| 6,900,693 B2 | 5/2005 | Sasho |
| 7,076,215 B1 * | 7/2006 | Moliere .......................... 455/77 |
| 7,305,041 B2 | 12/2007 | Anvari |
| 7,382,166 B1 | 6/2008 | Ide |
| 7,471,935 B2 | 12/2008 | Barak |
| 7,477,187 B2 | 1/2009 | Rofougaran |
| 7,525,347 B1 | 4/2009 | Luo |

(Continued)

FOREIGN PATENT DOCUMENTS

JP 60-145722 8/1985

*Primary Examiner* — Wen Huang
(74) *Attorney, Agent, or Firm* — Oblon, McClelland, Maier & Neustadt, L.L.P.

(57) ABSTRACT

According to one embodiment, a radio frequency (RF) transceiver includes a local oscillator generator (LOGEN) circuit configured to receive an adaptive supply voltage. The LOGEN circuit is coupled to a variable power supply for providing the adaptive supply voltage. A process monitor for the LOGEN circuit is in communication with the variable power supply through a power supply programming module. As a result, the adaptive supply voltage can be adjusted according to data supplied by the process monitor. A method for adaptively powering a LOGEN circuit comprises providing power to an RF device, monitoring a process corner of said LOGEN circuit, determining a supply voltage corresponding to the process corner, and adjusting the supply voltage to adaptively power the LOGEN circuit.

20 Claims, 4 Drawing Sheets

(56) References Cited

U.S. PATENT DOCUMENTS

| | | |
|---|---|---|
| 7,539,466 B2 | 5/2009 | Tan |
| 7,581,120 B1 * | 8/2009 | Hartman et al. .............. 713/300 |
| 7,626,777 B2 | 12/2009 | Aemireddy |
| 8,026,743 B2 | 9/2011 | Ou |
| 8,260,227 B2 | 9/2012 | Chiu |
| 8,311,155 B2 | 11/2012 | Umeda |
| 2004/0087293 A1 * | 5/2004 | Jaehne et al. ................. 455/260 |
| 2005/0118966 A1 | 6/2005 | Anvari |
| 2005/0218871 A1 * | 10/2005 | Kang et al. .................... 323/265 |
| 2006/0009174 A1 | 1/2006 | Dunn |
| 2006/0105723 A1 | 5/2006 | Anvari |
| 2007/0070534 A1 | 3/2007 | Aemireddy |
| 2007/0222525 A1 * | 9/2007 | Shimizu .......................... 331/16 |
| 2008/0003960 A1 | 1/2008 | Zolfaghari |
| 2008/0076363 A1 | 3/2008 | Rafi |
| 2008/0076372 A1 * | 3/2008 | Nutt .............................. 455/214 |
| 2008/0155282 A1 * | 6/2008 | Gammie et al. ............. 713/300 |
| 2009/0073070 A1 | 3/2009 | Rofougaran |
| 2009/0130994 A1 * | 5/2009 | Zhuo et al. ................... 455/90.2 |
| 2009/0298415 A1 * | 12/2009 | Gudem et al. .................... 455/1 |
| 2010/0090760 A1 | 4/2010 | Bachmann |
| 2010/0099369 A1 | 4/2010 | Ozgun |
| 2010/0159856 A1 | 6/2010 | Kato et al. |
| 2010/0266066 A1 | 10/2010 | Takahashi |
| 2010/0321124 A1 * | 12/2010 | Rangarajan et al. .... 331/117 FE |
| 2011/0057732 A1 * | 3/2011 | Taylor et al. ................. 455/341 |
| 2011/0076972 A1 * | 3/2011 | Cooley ....................... 455/154.1 |
| 2012/0046004 A1 | 2/2012 | Mirzaei |
| 2012/0052824 A1 | 3/2012 | Mirzaei |

* cited by examiner

ADAPTIVE POWERED LOCAL OSCILLATOR GENERATOR CIRCUIT AND RELATED METHOD

BACKGROUND OF THE INVENTION

1. Field of the Invention

The present invention is generally in the field of electronic circuits and systems. More specifically, the present invention is in the field of communications circuits and systems.

2. Background Art

Transceivers are typically used in communications systems to support transmission and reception of communications signals through a common antenna, for example at radio frequency (RF) in a cellular telephone or other mobile communication device. Although transmission and reception of communication signals may occur at RF, signal processing is typically performed at a lower frequency, such as at baseband, after down-conversion of a receive signal or prior to up-conversion of a transmit signal. Frequency conversion, either up-conversion or down-conversion, is usually performed by respective transmitter or receiver mixers included in the transceiver, which are in turn driven by local oscillator generator (LOGEN) circuits of the transceiver.

In a LOGEN circuit, the output of a voltage controlled oscillator (VCO) may be buffered and adjusted in frequency one or more times before being provided to drive one of the transmitter or receiver mixers of the transceiver. Because drive strength and low phase noise are important in LOGEN performance characteristics, conventional LOGEN circuits are powered so as to meet specifications for those parameters even under the most unfavorable conditions, which may only occasionally prevail. As a result, a conventional LOGEN may be designed and consistently powered to enable it to satisfy its phase noise and drive strength specifications for slow process corners at high temperature. However, the power consumption needed to satisfy the LOGEN performance requirements under those worst case conditions is greater than that needed for normal, and especially for favorable, conditions, e.g., typical and fast process corners, resulting in unnecessarily high power consumption by the transceiver during much of LOGEN circuit operation. In addition, the power consumption of the digital circuits, like digital LOGEN circuits, is proportional to the square of the supply voltage. The lower the supply voltage, the less power is consumed.

Thus, there is a need to overcome the drawbacks and deficiencies in the art by providing an adaptively powered LOGEN circuit suitable for implementation as part of a more modern mobile device transceiver and enabling reduced power consumption by the transceiver.

SUMMARY OF THE INVENTION

The present invention is directed to an adaptively powered local oscillator generator circuit and related method, substantially as shown in and/or described in connection with at least one of the figures, and as set forth more completely in the claims.

DETAILED DESCRIPTION OF THE INVENTION

The present invention is directed to an adaptively powered local oscillator generator (LOGEN) circuit and related method. Although the invention is described with respect to specific embodiments, the principles of the invention, as defined by the claims appended herein, can obviously be applied beyond the specifically described embodiments of the invention described herein. Moreover, in the description of the present invention, certain details have been left out in order to not obscure the inventive aspects of the invention. The details left out are within the knowledge of a person of ordinary skill in the art.

The drawings in the present application and their accompanying detailed description are directed to merely exemplary embodiments of the invention. To maintain brevity, other embodiments of the invention, which use the principles of the present invention are not specifically described in the present application and are not specifically illustrated by the present drawings.

Figure 1:
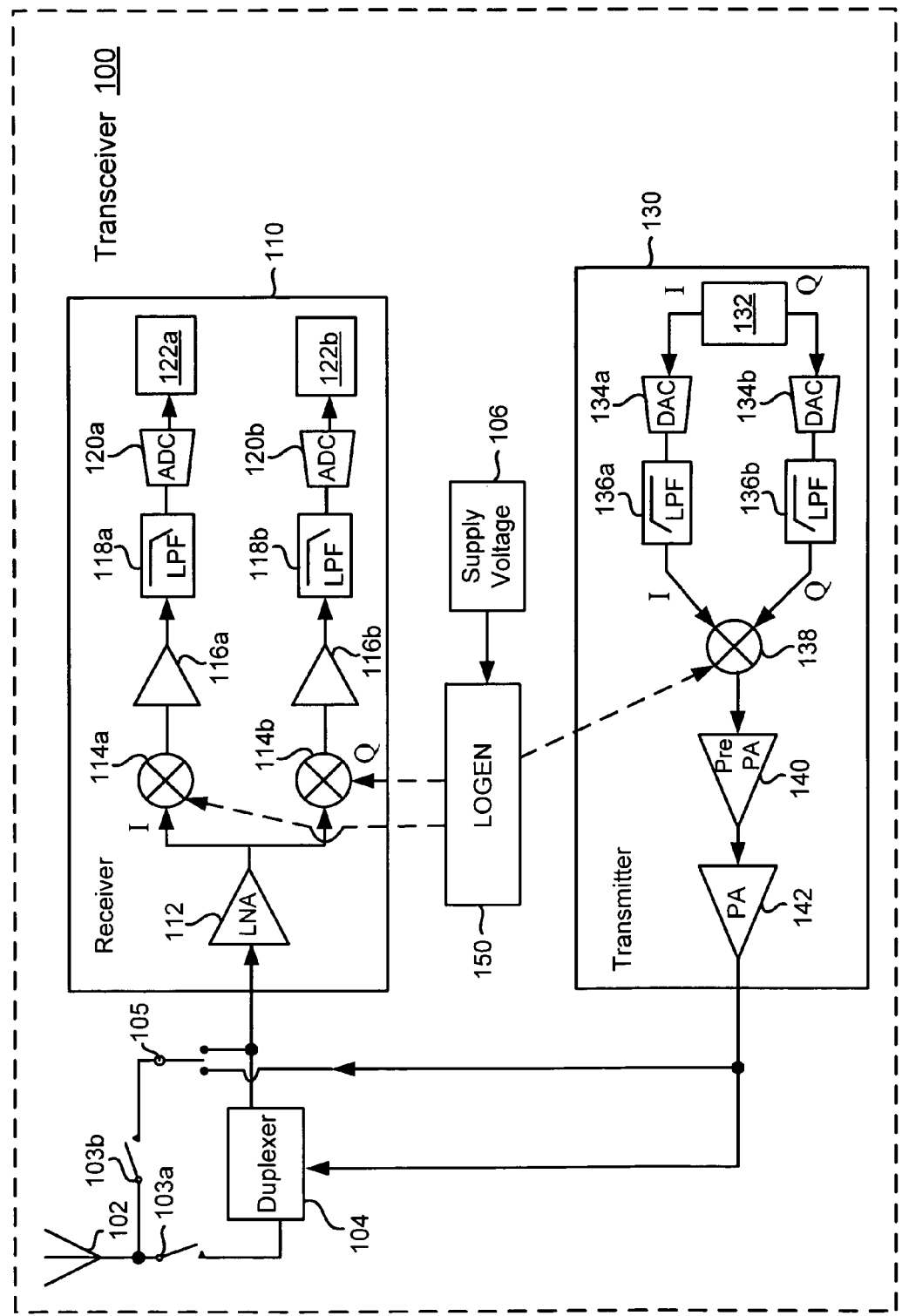
FIG. 1 is a conceptual block diagram showing a conventional local oscillator generator (LOGEN) circuit implementation in a transceiver.

FIG. 1 is a conceptual block diagram of transceiver 100 including conventional LOGEN circuit 150 powered by fixed supply voltage 106. In addition to conventional LOGEN circuit 150 and fixed supply voltage 106, transceiver 100 comprises antenna 102, transceiver input/output routing switches 103a and 103b, duplexer 104, transmit/receive (T/R) switch 105, receiver 110, and transmitter 130. As shown in FIG. 1, LOGEN circuit 150 powered by fixed voltage supply 106 is shared by receiver 110 and transmitter 130, and is implemented to provide a drive signal to their respective mixer circuits.

Receiver 110 includes low noise amplifier (LNA) 112, receiver mixers 114a and 114b working in conjunction with, respectively, in-phase (I) and quadrature-phase (Q) signals provided by LOGEN circuit 150, and transimpedance amplifiers (TIAs) 116a and 116b. As also shown in FIG. 1, receiver 110 further includes low-pass filters (LPFs) 118a and 118b, analog-to-digital converters (ADCs) 120a and 120b, and digital processors 122a and 122b, to perform back-end processing of the respective I and Q signal components.

As shown in FIG. 1, transmitter 130 includes digital block 132 providing I and Q outputs to respective digital-to-analog converters (DACs) 134a and 134b. In addition, transmitter 130 includes LPFs 136a and 136b, transmitter mixer 138 driven by LOGEN circuit 150 to combine and up-convert the I and Q signals to a transmit frequency, and power amplifier (PA) driver (pre-PA) 140 providing a preamplified transmit signal to PA 142, which can be coupled to antenna 102 of transceiver 100 through duplexer 104 via transceiver input/output routing switch 103a, or through T/R switch 105 via transceiver input/output routing switch 103b, as also shown by FIG. 1.

Drive strength, for example rail-to-rail voltage swing, and low phase noise are important performance parameters for LOGEN circuit 150. According to the conventional LOGEN circuit implementation shown in FIG. 1, fixed supply voltage 106 is set so as to satisfy specifications for those parameters even under the most unfavorable operating conditions. In other words, LOGEN circuit 150 may be consistently powered to enable it to satisfy its phase noise and drive strength specifications for slow process corners at high temperature. For example, LOGEN circuit 150 comprising devices requiring a nominal 1.2V supply, may instead receive a constant supply of 1.26V, or higher, in order to assure adequate performance for slow process corners.

However, the supply voltage actually required to satisfy the performance specifications for LOGEN circuit 150 may vary considerably, depending upon whether fast, slow, or typical process corners are present, for example. Moreover, because neutral or favorable operating conditions, e.g., conditions corresponding to typical or fast process corners, respectively, may be at least as likely to prevail as the least favorable operating state, LOGEN circuit 150 is likely to be receiving a higher than needed supply voltage much of the time, resulting in unnecessary power consumption by transceiver 100.

Particularly in situations in which the ultimate power source for transceiver 100 is characterized by having a fixed and finite energy reserve, such as is the case for a transceiver implemented in a mobile communication device and reliant on the mobile device battery for power, any unnecessary power drain poses a substantial disadvantage. Furthermore, as communications technologies continue to move in the direction of smaller device dimensions, higher device and system speeds, and smaller power supplies, as represented, for example, by the 40 nm technology node, the fundamental inefficiency represented by the conventional implementation shown in FIG. 1 becomes increasingly incongruous and undesirable.

Figure 2:
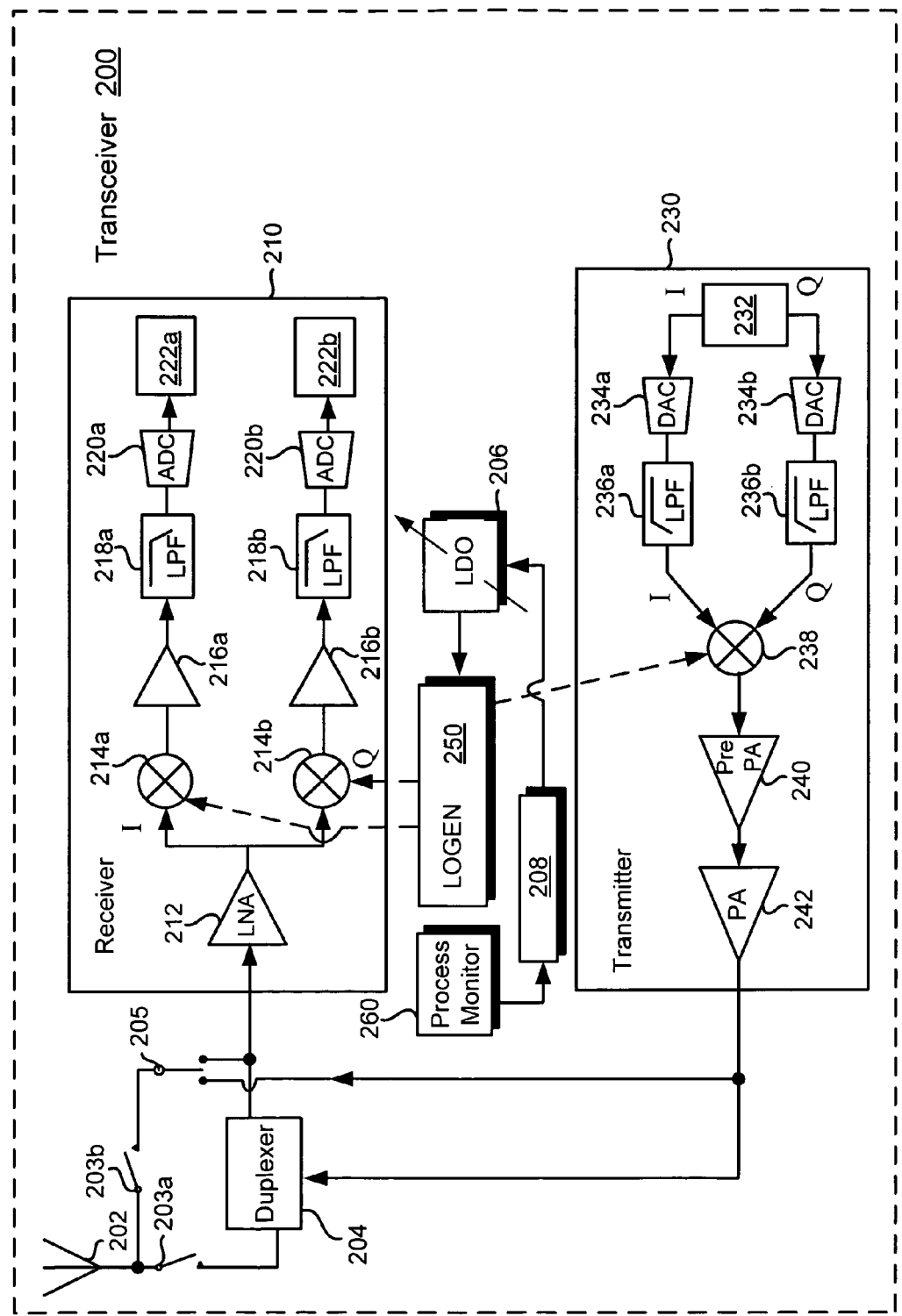
FIG. 2 is a conceptual block diagram of a transceiver including an adaptively powered LOGEN circuit, according to one embodiment of the present invention.

Turning to FIG. 2, FIG. 2 shows a conceptual block diagram of transceiver 200 including adaptively powered LOGEN circuit 250, according to one embodiment of the present invention, capable of overcoming the disadvantages associated with the conventional implementation described above in relation to FIG. 1. It is noted that the innovative adaptively powered LOGEN of the present invention, and its related concepts, can be used in any RF component or device, including but not limited to a transceiver. For example, the adaptively powered LOGEN of the present invention can be used in an RF receiver, an RF transmitter, or any other RF device, and not necessarily an RF transceiver. Thus, transceiver 200 is used as specific example of any "RF device" in the present application.

As shown in FIG. 2, transceiver 200 comprises antenna 202, transceiver input/output routing switches 203a and 203b, duplexer 204, T/R switch 205, receiver 210, and transmitter 230. In addition transceiver 200 also comprises a variable power supply, shown in the embodiment of FIG. 2 as exemplary variable low-dropout regulator (LDO) 206, LOGEN circuit 250 monitored by process monitor 260, and LDO programming module 208 mediating communication between process monitor 260 and variable LDO 206. In some embodiments, process monitor 260 is included as part of LOGEN circuit, while in others, process monitor 260 may be distinct from the circuitry comprised by LOGEN circuit 250. In either set of embodiments, however, process monitor 260 and LOGEN circuit 250 are integrated on a common semiconductor die.

According to the embodiment of FIG. 2, process monitor 260 is in communication with variable LDO 206 through LDO programming module 208. It is noted that although the embodiment of FIG. 2 shows variable LDO 206 and LDO programming module 208, more generally those features correspond to any suitable combination of a variable power supply and a power supply programming module enabling communication between process monitor 260 and the variable power supply. Moreover, although FIG. 2 depicts LDO programming module 208 as residing outside of variable LDO 206, that embodiment is provided for conceptual clarity. In some embodiments, for example, LDO programming module 208 may be incorporated into variable LDO 206. The particular embodiment shown in FIG. 2 enables adaptive adjustment of the supply voltage provided to LOGEN circuit 250 according to actual LOGEN circuit performance data. That performance data may be supplied to variable LDO 206 by process monitor 260 through LDO programming module 208, for example.

Receiver 210 of transceiver 200 includes LNA 212, receiver mixers 214a and 214b working in conjunction with, respectively, I and Q signals provided by LOGEN circuit 250, and TIAs 216a and 216b. Receiver 210 is also shown to include LPFs 218a and 218b, ADCs 220a and 220b, and digital processors 222a and 222b, to perform back-end processing of the respective I and Q signal components. Transmitter 230 of transceiver 200 includes digital block 232 providing I and Q outputs to respective DACs 234a and 234b. In addition, transmitter 230 includes LPFs 236a and 236b, transmitter mixer 238 driven by LOGEN circuit 250 to combine and up-convert the I and Q signals to a transmit frequency, and pre-PA 240 providing a preamplified transmit signal to PA 242, which can be coupled to antenna 202 of transceiver 200 through duplexer 204 via transceiver input/output routing switch 203a, or through T/R switch 205 via transceiver input/output routing switch 203b.

Transceiver 200 may be utilized in a cellular telephone or other mobile device communicating at radio frequency (RF), for example, such as in a frequency range from approximately 0.8 GHz to approximately 2.2 GHz, for example. Moreover, as shown by FIG. 2, transceiver 200 may be a multi-mode communication system, for example, capable of operating in one or more second-generation wireless telephone technology (2G) modes through use of routing switch 203b and T/R switch 205, and further configured to operate in one or more 3G modes through use of routing switch 203a and duplexer 204.

In marked contrast to the conventional implementation shown in FIG. 1, LOGEN circuit 250 is configured to be adaptively powered according to its actual supply voltage needs, as measured, for example, by its actual performance, rather than its worst case performance. As previously mentioned, in practice, the supply voltage actually required to satisfy the performance specifications for LOGEN circuit 250, such as a phase noise or drive strength specification for LOGEN 250, or some other performance constraint bearing on the operation of transceiver 200, may vary considerably. That variance may depend, for example, upon whether fast, slow, or typical process corners characterize the actual performance of LOGEN circuit 250 during a particular time interval, and under actual performance conditions, such as temperature. By providing process monitor 260, monitoring the performance of LOGEN circuit 250 using process monitor 260, and adapting the supply voltage provided to LOGEN circuit 250 by variable LDO 206 according to the actual performance of LOGEN circuit 250, the present approach enables dynamically adapting the supply voltage provided to LOGEN circuit according to its needs.

As a result, the supply voltage provided to LOGEN circuit 250 may be a minimum supply voltage for which a performance constraint of LOGEN circuit 250, or transceiver 200 as a whole, is satisfied. For example, process monitor 260 may supply performance data regarding LOGEN circuit 250 corresponding to a process corner of LOGEN circuit 250. Depending on which of a slow, typical, or fast corner is presently detected, variable LDO 206 can adaptively adjust the supply voltage provided to LOGEN circuit 250 so as to provide, respectively a relatively high, moderate, or low supply voltage. Consequently, variable LDO may be dynamically responsive to the actual performance of LOGEN circuit 250 so as to provide a substantially minimum voltage necessary for LOGEN circuit 250 to satisfy its phase noise performance specification and to supply adequate drive strength.

For implementations in which LOGEN circuit 250 comprises devices requiring a nominal 1.2V, for example, LOGEN circuit 250 may receive an actual supply voltage ranging below 1.2V when fast process corners prevail, for example, rather receiving a fixed and constant supply of 1.2V, or higher, to assure adequate performance for slow process corners at all times, as in the conventional approach illustrated in FIG. 1. When slow process corners prevail, LOGEN circuit 250 may receive an actual supply voltage ranging above 1.2V to satisfy the circuit performance. This way, LOGEN circuit 250 can be designed using less power consumption for typical device corners. The overall power usage is much more efficient using this dynamic adjustment. In general, the power consumption rating is based on the power consumption in the typical device corners and typical temperatures. Thus, the solution embodied in FIG. 2 can enable significant and appropriately targeted reductions in the power consumed by LOGEN circuit 250 and receiver 200 as a whole. Furthermore, in one embodiment, LOGEN circuit 250, process monitor 260, variable LDO 206, and LDO programming module 208 can be included with the constituents of receiver 210, as well as digital block 232, DACs 234a and 234b, LPFs 236a and 236b, transmitter mixer 238, and pre-PA 240 of transmitter 230 on an integrated circuit (IC) fabricated on a single semiconductor die using a 40 nm process technology, for example.

Figure 3:
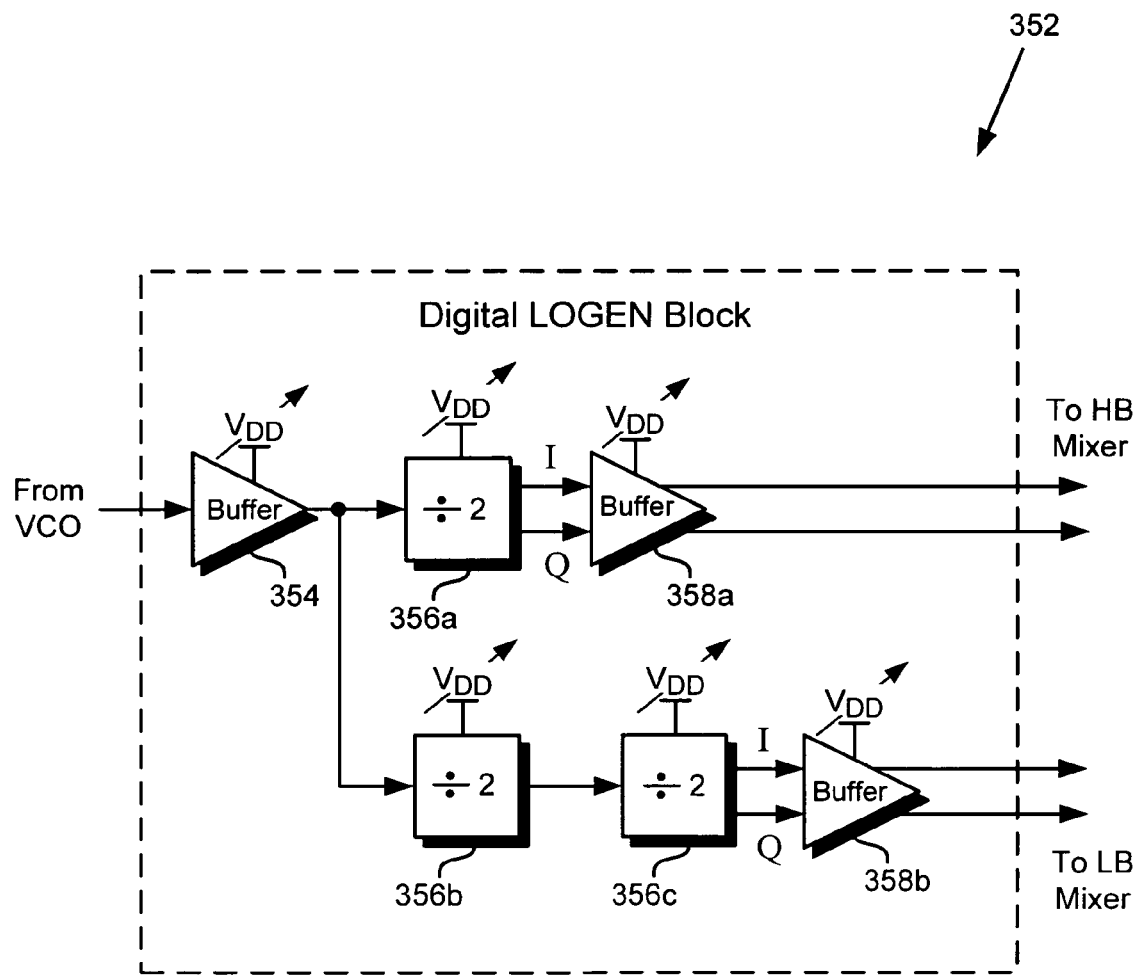
FIG. 3 illustrates a digital block of a LOGEN circuit receiving an adaptive supply voltage, according to one embodiment of the present invention.
Figure 4:
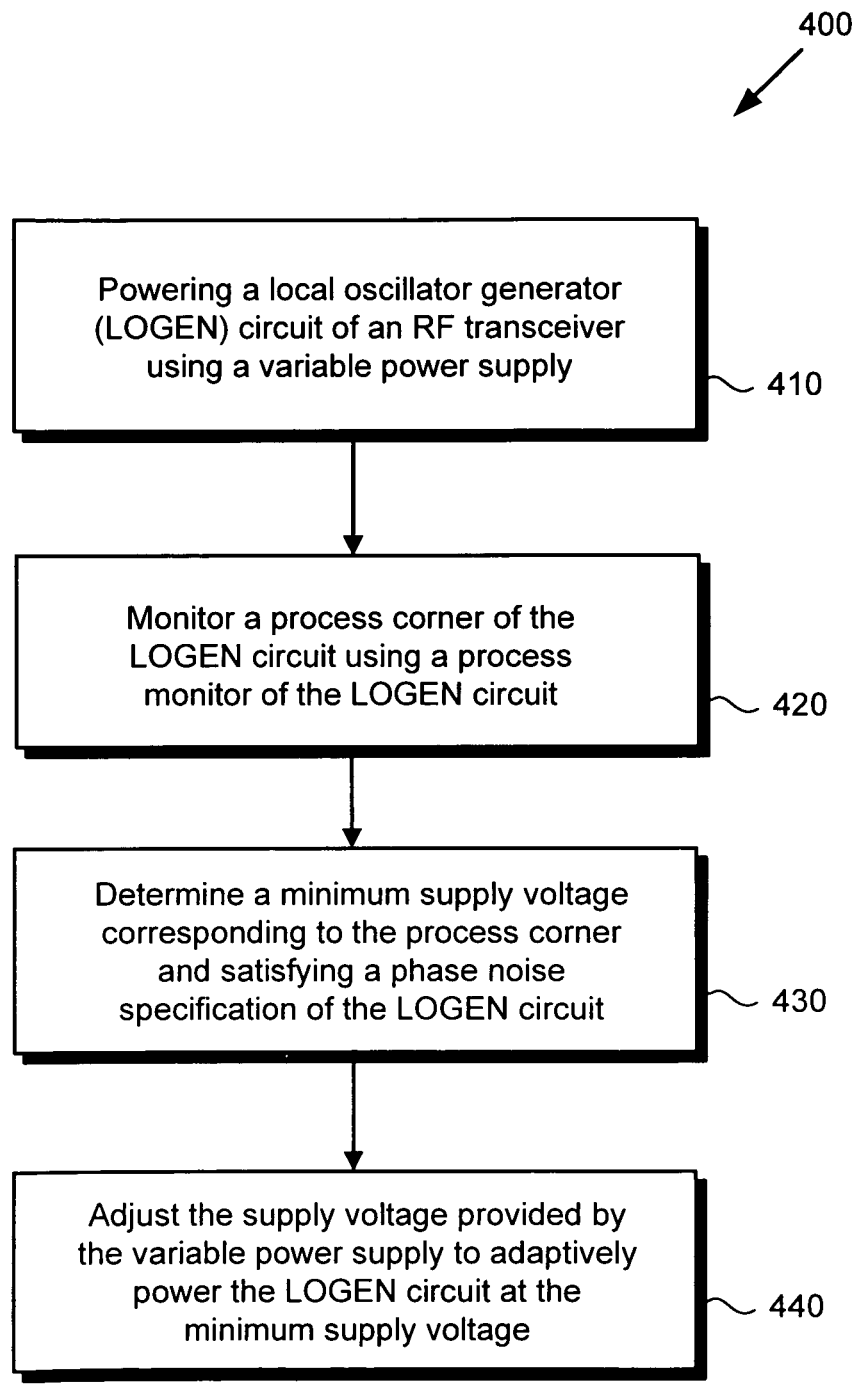
FIG. 4 is a flowchart presenting a method for adaptively powering a LOGEN circuit, according to one embodiment of the present invention.

The operation of adaptively powered LOGEN circuit 250 will now be further described in conjunction with FIGS. 3 and 4. FIG. 3 shows a digital block of a LOGEN circuit configured to receive a variable supply voltage, according to one embodiment of the present invention. FIG. 4 is a flowchart presenting a method for adaptively powering a LOGEN circuit, according to one embodiment of the present invention.

Referring to FIG. 3, FIG. 3 shows digital LOGEN block 352 configured to receive an adaptive supply voltage, according to one embodiment of the present invention. As shown in FIG. 3, digital LOGEN block 352 is implemented as part of a LOGEN circuit, and is configured to receive an input signal from a voltage controlled oscillator (VCO) of the LOGEN circuit (VCO not shown in FIG. 3) and to provide output signals to high-band and low-band mixers of the LOGEN circuit (high-band and low-band mixers also not shown in FIG. 3). Thereafter, the suitably mixed high-band and low-band outputs signals of the LOGEN circuit may be provided as drive signals to a receiver or transmitter mixer. Thus, digital LOGEN block 352 may correspond to digital circuitry within LOGEN circuit 250, in FIG. 2, which as described in conjunction with that previous figure is monitored by process monitor 260. Consequently, the actual performance of digital LOGEN block 352, in FIG. 3, is also undergoing monitoring by a process monitor, such as process monitor 260, in FIG. 2.

As further shown in FIG. 3, digital LOGEN block 352 comprises input buffer 354 for receiving the input signal from the LOGEN circuit VCO, and both high-band and low-band signal generation paths coupled to the output of buffer 354. A high-band signal generation path may include divide-by-two block 356a and high-band buffer 358a for buffering the I and Q outputs of divide-by-two block 356a prior to outputting buffered I and Q signals to the high-band mixer of the LOGEN circuit. Analogously, a low-band signal generation path may comprise sequential divide-by-two blocks 356b and 356c, and low-band buffer 358b for buffering the I and Q outputs of divide-by-two block 356c prior to outputting buffered I and Q signals to the low-band mixer of the LOGEN circuit, as represented in FIG. 3. As further shown in FIG. 3, each of input buffer 354, divide-by-two blocks 356a, 356b, and 356c, and buffers 358a and 358b is configured to receive a variable supply $V_{DD}$.

Input buffer 354, divide-by-two blocks 356a, 356b, and 356c, and buffers 358a and 358b may be implemented as digital circuitry, as represented by their inclusion in digital LOGEN block 352. Because the performance of digital circuit components is known to respond in a particularly predictable manner to variations in supply voltage, the adaptive power approach disclosed by embodiments of the present invention may prove to be especially advantageous when applied to digital circuitry, such as digital LOGEN block 352.

Continuing now to FIG. 4, FIG. 4 presents flowchart 400 describing one embodiment of a method for adaptively powering a LOGEN circuit. Certain details and features have been left out of flowchart 400 that are apparent to a person of ordinary skill in the art. For example, a step may comprise one or more substeps or may involve specialized equipment or materials, as known in the art. While steps 410 through 440 indicated in flowchart 400 are sufficient to describe one embodiment of the present invention, other embodiments of the invention may utilize steps different from those shown in flowchart 400, or may comprise more, or fewer, steps.

Step 410 of flowchart 400 comprises powering a LOGEN circuit of an RF transceiver using a variable power supply. Referring to FIG. 2, step 410 may be seen to correspond to powering LOGEN circuit 250 of transceiver 200 using variable LDO 206. In it's various embodiments, transceiver 200 including adaptively powered LOGEN circuit 250 can be implemented in, for example, a wireless communications device, a cellular telephone, a Bluetooth enabled device, a computer, a satellite set-top box, an RF transceiver, a personal digital assistant (PDA), or in any other kind of system, device, component or module utilized as a transceiver in modern electronics applications. In one embodiment, in order to ensure that a phase noise or drive strength specification for LOGEN circuit 250 can be met immediately upon power-up of transceiver 200, step 410 may correspond to providing LOGEN 250 with a default high supply voltage corresponding to performance under worst case operating conditions for example.

Although step 410 of flowchart 400 characterizes the present method as providing adaptive power to a LOGEN circuit, such as LOGEN circuit 250, in FIG. 2, more generally, the method described by flowchart 400 can be applied so as to adaptively power a variety of circuits. More specifically, and as described above, circuits comprising digital components are know to respond in a particularly predictable manner to variations in supply voltage, rendering the adaptive powering approach of the present method especially advantageous when applied to digital circuitry, which may comprise digital circuitry other than circuitry comprised by a LOGEN circuit.

Continuing with step 420 in FIG. 4, step 420 of flowchart 400 comprises monitoring a process corner of the LOGEN circuit. Referring once again to FIG. 2, step 420 can be performed by process monitor 260 for LOGEN circuit 250. For example, process monitor 260 may comprise a ring oscillator, fabricated as part of LOGEN circuit 250, and implemented so as to sense whether a low, typical, or fast process corner corresponds to the actual performance profile of LOGEN circuit 250 at a particular point in time.

Moving to step 430 of FIG. 4 and continuing to refer to transceiver 200 including adaptively powered LOGEN circuit 250, in FIG. 2, step 430 of flowchart 400 comprises determining a minimum supply voltage corresponding to the process corner identified through monitoring in step 420, and satisfying a phase noise specification of LOGEN circuit 250. Step 430 may be performed by LDO programming module 208, for example, which may be configured to determine a minimum supply voltage based on data supplied by process monitor 260. More generally, LDO programming module 208 may be configured to determine a minimum supply voltage for LOGEN circuit 250 sufficient to satisfy any of a variety of performance constraints on LOGEN circuit 250, or on transceiver 200.

Continuing with step 440 of flowchart 400, step 440 comprises adjusting the supply voltage provided by the variable power supply to adaptively power LOGEN circuit 250 at a minimum supply voltage. According to the embodiment shown in FIG. 2, step 440 may be performed by variable LDO 206 in response to a communication received from process monitor 260 through LDO programming module 208. For example, subsequent to determining a minimum adequate supply voltage for LOGEN circuit 250 by LDO programming module 208 in step 430, LDO programming module 208 may write a code setting the output voltage of variable LDO 206 to a control registry of variable LDO 206. Changes or updates to that code LDO programming module 208 can result in adjustment of the supply voltage output by variable LDO 206, thereby causing variable LDO 206 to adaptively adjust the supply voltage provided to LOGEN circuit 250 according to the actual performance of LOGEN circuit 250, as measured by performance data supplied by process monitor 260.

Thus, by monitoring the present actual performance of a digital circuit, such as a digital LOGEN block, and supplying the performance data to a process monitor, embodiments of the present invention enable an accurate assessment of the power needs of the digital circuit. Moreover, by adaptively adjusting a supply voltage provided to the digital circuit by a variable power supply according to the performance data, embodiments of the present invention enable an approach to dynamic power management capable of optimizing the power consumed by the digital circuit while satisfying its performance constraints. For example, when implemented to adaptively power a LOGEN circuit comprised by an RF transceiver, embodiments of the present invention enable adaptive adjustment of the supply voltage provided to the LOGEN circuit so as to substantially minimize the supply voltage while concurrently satisfying phase noise and drive strength requirements, thereby reducing power consumption by the LOGEN circuit and the RF transceiver as a whole, without compromising performance.

From the above description of the invention it is manifest that various techniques can be used for implementing the concepts of the present invention without departing from its scope. Moreover, while the invention has been described with specific reference to certain embodiments, a person of ordinary skill in the art would recognize that changes can be made in form and detail without departing from the spirit and the scope of the invention. The described embodiments are to be considered in all respects as illustrative and not restrictive. It should also be understood that the invention is not limited to the particular embodiments described herein, but is capable of many rearrangements, modifications, and substitutions without departing from the scope of the invention.

The invention claimed is:

1. A local oscillator generator (LOGEN) circuit, which is coupled to a variable power supply external to the LOGEN circuit, is configured to:
receive an adaptive supply voltage from the variable power supply so as to power the LOGEN circuit, the variable power supply being in communication with a process monitor such that the adaptive supply voltage is dynamically adjusted according to data supplied by the process monitor, the dynamic adjustment of the adaptive supply voltage being based on a continuous monitoring of an actual performance of the LOGEN circuit; and
provide an output signal to drive at least one of a radio frequency (RF) receiver mixer and an RF transmitter mixer, wherein:
the data supplied by the process monitor corresponds to a process corner of said LOGEN circuit, the process corner being a slow, typical, or fast corner; and
the adaptive supply voltage is adjusted to a minimum supply voltage in order to satisfy a phase noise requirement and a drive strength requirement.

2. The LOGEN circuit of claim 1, wherein said minimum supply voltage is below approximately 1.2V.

3. The LOGEN circuit of claim 2, wherein said LOGEN circuit is within a radio frequency (RF) transceiver implemented in a mobile communication device.

4. The LOGEN circuit of claim 2, wherein said data supplied by said process monitor corresponds to a temperature of said LOGEN circuit.

5. The LOG EN circuit of claim 1, wherein said LOGEN circuit is within a radio frequency (RF) transceiver implemented in a mobile communication device.

6. The LOGEN circuit of claim 5, wherein said data supplied by said process monitor corresponds to a temperature of said LOGEN circuit.

7. The LOG EN circuit of claim 1, wherein said data supplied by said process monitor corresponds to a temperature of said LOGEN circuit.

8. The LOGEN circuit of claim 1, wherein said minimum supply voltage is below 1.2V.

9. A radio frequency (RF) transceiver comprising:
a local oscillator generator (LOG EN) circuit configured to provide an output signal to drive at least one of a receiver mixer and a transmitter mixer of said RF transceiver;
a variable power supply external to said LOGEN circuit to provide an adaptive supply voltage to power said LOGEN circuit; and
a process monitor in communication with said variable power supply through a power supply programming module, wherein:
said adaptive supply voltage is dynamically adjusted according to data supplied by said process monitor, the dynamic adjustment of the adaptive supply voltage being based on a continuous monitoring of an actual performance of the LOGEN circuit;
the adaptive supply voltage is adjusted to a minimum supply voltage in order to satisfy a phase noise requirement and a drive strength requirement; and
the data supplied by the process monitor corresponds to a process corner of said LOGEN circuit, the process corner being a slow, typical, or fast corner.

10. The RF transceiver of claim 9, wherein said RF transceiver is implemented in a mobile communication device.

11. The RF transceiver of claim 10, wherein said minimum supply voltage is below approximately 1.2V.

12. The RF transceiver of claim 10, wherein said data supplied by said process monitor corresponds to a temperature of said LOGEN circuit.

13. The RF transceiver of claim 9, wherein said minimum supply voltage is below approximately 1.2V.

14. The RF transceiver of claim 13, wherein said data supplied by said process monitor corresponds to a temperature of said LOGEN circuit.

15. The RF transceiver of claim 9, wherein said data supplied by said process monitor corresponds to a temperature of said LOGEN circuit.

16. A method for utilizing a local oscillator generator (LOGEN) circuit in a radio frequency (RF) device, said method comprising:
powering said RF device;
monitoring a process corner of said LOGEN circuit, the process corner being a slow, typical, or fast corner;

dynamically adjusting a supply voltage corresponding to said process corner to adaptively power said LOGEN circuit, the dynamic adjustment of the supply voltage being based on a continuous monitoring of an actual performance of the LOGEN circuit, wherein said supply voltage is provided by a variable power supply external to said LOGEN circuit;

adjusting the adaptive supply voltage to a minimum supply voltage in order to satisfy a phase noise requirement and a drive strength requirement; and utilizing said LOGEN circuit to provide an output signal to drive at least one of a receiver mixer and a transmitter mixer of said RF device.

17. The method of claim 16, wherein said RF device comprises an RF receiver.

18. The method of claim 16, wherein said RF device comprises an RF transmitter.

19. The method of claim 16, wherein said RF device is an RF transceiver.

20. The method of claim 16, wherein said minimum supply voltage is below approximately 1.2V.

* * * * *